(12) United States Patent
Huang et al.

(10) Patent No.: US 9,191,034 B2
(45) Date of Patent: Nov. 17, 2015

(54) ARBITRARY SAMPLE RATE CONVERSION FOR COMMUNICATION SYSTEMS

(75) Inventors: Xiaojing Huang, North Ryde (AU); Yingjie Jay Guo, Beecroft (AU); Jian Zhang, Beecroft (AU)

(73) Assignee: Commonwealth Scientific and Industrial Research Organisation, Campbell (AU)

( * ) Notice: Subject to any disclaimer, the term of this patent is extended or adjusted under 35 U.S.C. 154(b) by 0 days.

(21) Appl. No.: 14/003,639

(22) PCT Filed: Mar. 9, 2011

(86) PCT No.: PCT/AU2011/000265
§ 371 (c)(1),
(2), (4) Date: Dec. 19, 2013

(87) PCT Pub. No.: WO2012/119178
PCT Pub. Date: Sep. 13, 2012

(65) Prior Publication Data
US 2014/0105325 A1    Apr. 17, 2014

(51) Int. Cl.
*H04L 25/03* (2006.01)
*H04B 1/00* (2006.01)
(Continued)

(52) U.S. Cl.
CPC ........... *H04B 1/0017* (2013.01); *H03H 17/028* (2013.01); *H03H 17/0642* (2013.01);
(Continued)

(58) Field of Classification Search
CPC .......... H04B 3/04–3/18; H04B 1/0475; H04B 1/62–1/64; H04B 7/005; H04L 7/0008–7/0012; H04L 7/0091

USPC .......... 375/260, 284, 285, 267, 295, 296, 355
See application file for complete search history.

(56) References Cited

U.S. PATENT DOCUMENTS

| 5,764,039 A | 6/1998 | Choi et al. |
| 2001/0050592 A1* | 12/2001 | Wright et al. ..................... 330/2 |

(Continued)

FOREIGN PATENT DOCUMENTS

GB    2372393 A    8/2002

OTHER PUBLICATIONS

PCT Patent Office International Search Report, Jul. 6, 2011, 4 pgs. (Australian Patent Office as International Search Authority).
(Continued)

*Primary Examiner* — Dac Ha
(74) *Attorney, Agent, or Firm* — Wood, Herron & Evans, LLP

(57) ABSTRACT

Disclosed is a communication modulator with sample rate conversion. The modulator comprises a symbol mapping module configured to map an input bitstream to a symbol sequence; a pre-distortion module configured to multiply the symbol sequence by a discrete frequency response to produce a pre-distorted symbol sequence; a modulation module configured to modulate the pre-distorted symbol sequence to a time-domain baseband sample sequence; a sample rate conversion module configured to convert the sample rate of the baseband sample sequence to a different sample rate to produce a sample-rate-converted baseband sample sequence; and an up-conversion module configured to up-convert the sample-rate-converted baseband sample sequence to an intermediate frequency signal. The discrete frequency response by which the pre-distortion module multiplies the symbol sequence is configured to compensate for passband droop introduced to the sample-rate-converted baseband sample sequence by the sample rate conversion module.

4 Claims, 11 Drawing Sheets

(51) Int. Cl.
  *H03H 17/02* (2006.01)
  *H03H 17/06* (2006.01)
  *H04L 27/26* (2006.01)
  *H04L 25/14* (2006.01)

(52) U.S. Cl.
  CPC ........ *H04L27/2628* (2013.01); *H04L 27/2644* (2013.01); *H04L 27/2649* (2013.01); *H04L 25/03828* (2013.01); *H04L 25/03834* (2013.01); *H04L 25/03878* (2013.01); *H04L 25/14* (2013.01)

(56) References Cited

U.S. PATENT DOCUMENTS

| | | | | |
|---|---|---|---|---|
| 2004/0008793 | A1* | 1/2004 | Mujica et al. | 375/260 |
| 2006/0235638 | A1 | 10/2006 | Verspecht | |
| 2009/0124218 | A1* | 5/2009 | McCallister et al. | 455/114.2 |
| 2011/0007836 | A1 | 1/2011 | Schlee et al. | |

OTHER PUBLICATIONS

International Preliminary Report on Patentability issued in corresponding International Patent Application No. PCT/AU2011/000265, issue date Sep. 10, 2013 (7 pages).

Tim Hentschele T Al: Sample Rate Conversion for Software Radio, IEEE Communications Magazine, IEEE Service Center, Piscataway, US, vol. 38, No. 8, Aug. 1, 2000.

Xiaojing Huang: "Arbitrary Ratio Sample Rate Conversion Using B-Spline Interpolation for Software Define Radio," Proceedings of the First IEEE Itnernational Conference on Wireless Broadband and Ultira-Wideband Communications, Jan. 1, 2006.

EPO Search Report, Jul. 23, 2014.

* cited by examiner

ARBITRARY SAMPLE RATE CONVERSION FOR COMMUNICATION SYSTEMS

TECHNICAL FIELD

The present invention relates generally to communication systems and, in particular, to converting signal sample rates by arbitrary ratios in communication systems.

BACKGROUND

With the advance in digital signal processing and wireless communication technologies, software defined radio (SDR) has become a reality. For SDR with multi-protocol and/or multiband capabilities, sample rate conversion (SRC) is an important element in the digital signal processing architecture of the SDR. Using SRC, digitally modulated discrete-time signals at different sample rates specific to different protocols and/or frequency bands are up-sampled into discrete-time signals with a common sample rate, which are then converted into an analog signal by a digital-to-analog (D/A) converter at the common sample rate. At the receiver, the received signal is digitised by an analog-to-digital (A/D) converter at the common sample rate and, again using SRC, variously down-sampled into streams of discrete-time signals at different sample rates specific to different protocols and/or frequency bands. Different sample rates may even be used in a single communication protocol, such as the IEEE 802.11g wireless local area network (WLAN) specification.

Using a fixed sample rate for D/A and A/D converters in an SDR-type multiband or multi-protocol communication system has a number of advantages. For example, it preserves the modularity of the system, reduces the system complexity, and provides better reconfigurability. Also, the D/A or A/D converter with a fixed sample rate has much lower jitter than a D/A or A/D converter with an adjustable sample rate. If the D/A or A/D converter operates with a fixed clock, the clock-jitter performance can be significantly improved and system integration can be greatly simplified.

In a digital communication system, the D/A or A/D sample rate is usually four to eight times the data symbol rate. If a band-pass signal is to be generated or received in the digital domain, such as in a multiband system, the sample rate will be significantly higher than that multiple. When the desired sample rate is an integer multiple of the symbol rate, the up-sampling or down-sampling process is straightforward. However, there are many applications where the ratio by which the discrete-time signal must be up-sampled or down-sampled is not an integer. Hence, the SRC method used should be able to accommodate an arbitrary non-integer conversion ratio.

SRC is theoretically a process of continuous-time signal reconstruction, or interpolation, followed by re-sampling at the desired sample rate. The interpolation is ideally realized by a Nyquist low-pass filter, which converts the discrete-time signal to a continuous-time signal without distortion. Since the ideal Nyquist filter is neither possible nor necessary in practice, how to select and implement an appropriate interpolation filter is the key issue for efficient SRC.

Various SRC structures have been proposed. The most popular and computationally efficient approach for SRC is to use the cascaded integrator-comb (CIC) filter due to its simple implementation (no multiplication is required). However, there are a few drawbacks with the CIC filter. First, it has a very wide transition band, and introduces attenuation in the passband of interest. An additional decimating low-pass filter is usually required to compensate for the passband droop. Second, it works only when the conversion ratio is rational-valued. Third, for some conversion ratios, CIC filtering has to be performed at a very high intermediate sample rate. To avoid the second stage decimating filter, different sharpened CIC filters have been proposed. However, the wide transition band and the limitation to rational-valued conversion ratios remain the same. A method for irrational conversion ratio SRC has been proposed based on the use of parallel CIC filters and linear interpolation, but the passband droop is even worse.

Different types of piecewise polynomial interpolation can be used for arbitrary ratio SRC, but the computational cost is very high. For example, the polynomial coefficient calculation requires multiplications in the order of $P^2$ to $P^3$, where P is the order of the polynomial, and the interpolation calculation requires additional multiplications in the order of P to $P^2$. The Farrow structure which consists of a filter bank and a fractional delay multiplication block is widely used for efficient implementation of piecewise polynomial interpolation, but the required number of multiplications is still $P^2+P$.

A B-spline is a piecewise continuous function which is constructed through repeated convolution of a basis function with itself. B-splines are suitable for interpolation due to their high degree of smoothness. A P-th order B-spline is of regularity P−1, meaning that it is continuously differentiable P−1 times. A centred B-spline can be efficiently implemented using the Farrow structure. However, since the frequency response of a B-spline is a power of the sinc function, the passband droop is still significant. Time-domain pre-filtering is normally implemented in B-spline interpolation for passband droop compensation, which considerably increases the interpolation complexity.

A typical digital communication system uses a transmitter filter (or pulse shaping filter) to limit the bandwidth of the transmitted signal. A receiver filter, which is usually a matched-filter having the same magnitude response as that of the transmitter filter, sometimes combined with an equalizer, is used in the receiver to achieve high signal-to-noise ratio and low inter-symbol interference. These filters are typically implemented digitally in the time domain for an SDR. Thus, combining the transmitter filter or the receiver filter with the SRC seems to be an attractive solution to relax the constraints on the SRC interpolation filter and to achieve overall complexity reduction. Using this approach, an SRC structure which includes a pulse shaping filter to compensate for the passband droop has been proposed. Unfortunately, since the CIC filter is still used for SRC, the application of this method is limited to rational conversion ratio SRC. Moreover, the pulse shaping filter design is complicated as it resorts to linear programming. An arbitrary ratio SRC structure using B-splines has been proposed, which combines the interpolation filter with the transmitter/receiver filter and compensates for the passband droop by digital filtering operating in the discrete-time domain at an up-sampled intermediate sample rate. However, the required discrete-time-domain digital filtering still contributes significantly to the complexity of the SRC processing.

SUMMARY

Disclosed are devices and methods for sample rate conversion (SRC) in orthogonal frequency division multiplexing (OFDM)-based multiband or multi-protocol communication systems where a digital sub-system at either end of the system transmits or receives digital intermediate frequency (IF) signals and processes digital baseband signals. The SRC takes place between the digital baseband sample rate and the digital IF sample rate. The digital IF sample rate is fixed and used for A/D and D/A conversion, whereas the digital baseband sample rates are varying depending on the bandwidth of the frequency bands used in the system. For the multiband OFDM transmitter, the disclosed system uses B-spline interpolation for SRC from digital baseband to digital IF. The width of the interpolating B-spline basis function is the same as the corresponding input sampling period (this is called single-width B-spline). The passband droop introduced by the B-spline interpolation is compensated in the frequency domain and combined with the OFDM modulation. For the multiband receiver, B-spline interpolation is used for SRC from digital IF to digital baseband. The width of the interpolating B-spline basis function is an integer multiple of the input sampling period (this is called multi-width B-spline). The passband droop introduced by the B-spline interpolation as well as any distortion introduced by the channel is equalized in the frequency domain and combined with the OFDM demodulation. Also disclosed are structures for general multi-width B-spline-based sample rate conversion.

According to a first aspect of the present disclosure, there is provided a communication modulator with sample rate conversion, the modulator comprising a symbol mapping module configured to map an input bitstream to a symbol sequence; a pre-distortion module configured to multiply the symbol sequence by a discrete frequency response to produce a pre-distorted symbol sequence; a modulation module configured to modulate the pre-distorted symbol sequence to a time-domain baseband sample sequence; a sample rate conversion module configured to convert the sample rate of the baseband sample sequence to a different sample rate to produce a sample-rate-converted baseband sample sequence; and an up-conversion module configured to up-convert the sample-rate-converted baseband sample sequence to an intermediate frequency signal; wherein the discrete frequency response by which the pre-distortion module multiplies the symbol sequence is configured to compensate for passband droop introduced to the sample-rate-converted baseband sample sequence by the sample rate conversion module.]

According to a second aspect of the present disclosure, there is provided a method of modulating a symbol sequence, the method comprising: multiplying the symbol sequence by a discrete frequency response; to produce a pre-distorted symbol sequence modulating the pre-distorted symbol sequence to a time-domain baseband sample sequence; converting the sample rate of the baseband sample sequence to a different sample rate to produce a sample-rate-converted baseband sample sequence; and up-converting the sample-rate-converted baseband sample sequence to an intermediate frequency signal, wherein the discrete frequency response is configured to compensate for passband droop introduced to the sample-rate-converted baseband sample sequence by the sample rate converting step.

According to a third aspect of the present disclosure, there is provided a communication demodulator with sample rate conversion, the demodulator comprising: a down-conversion module configured to down-convert a component of a received intermediate frequency signal to a baseband sample sequence; a sample rate conversion module configured to convert the sample rate of the baseband sample sequence to a different sample rate to produce a sample-rate-converted baseband sample sequence; and a demodulation module configured to demodulate the sample-rate-converted baseband sample sequence to a symbol sequence, wherein the sample rate conversion module includes an interpolation filter whose frequency response is a product of one or more sinc functions, each sinc function having nulls at integer multiples of the sampling frequency of the baseband sample sequence divided by an integer that is greater than one.

According to a fourth aspect of the present disclosure, there is provided a method of demodulating an intermediate frequency signal, the method comprising down-converting a component of the intermediate frequency signal to a baseband sample sequence; converting the sample rate of the baseband sample sequence to a different sample rate to produce a sample-rate-converted baseband sample sequence; and demodulating the sample-rate-converted baseband sample sequence to a symbol sequence, wherein the step of converting the sample rate of the baseband sample sequence uses an interpolation filter whose frequency response is a product of one or more sinc functions, each sinc function having nulls at integer multiples of the sampling frequency of the baseband sample sequence divided by an integer that is greater than one.

According to a fifth aspect of the present disclosure, there is provided a device for sample rate conversion of an input sequence based on a causal B-spline of duration equal to an integer multiple of the product of the sampling period of the input sequence and the order of the causal B-spline, the device comprising a delay-and-difference network configured to produce a plurality of intermediate sequences from the input sequence; and a plurality of multiply-add ladder structures configured to multiply each successive intermediate sequence by a fractional interval and add the product to the next intermediate sequence, wherein the outputs of the ladder structures are added to form the sample-rate-converted output sequence.

DESCRIPTION OF THE DRAWINGS

At least one embodiment of the present invention will now be described with reference to the drawings, in which.

DETAILED DESCRIPTION

Figure 1:
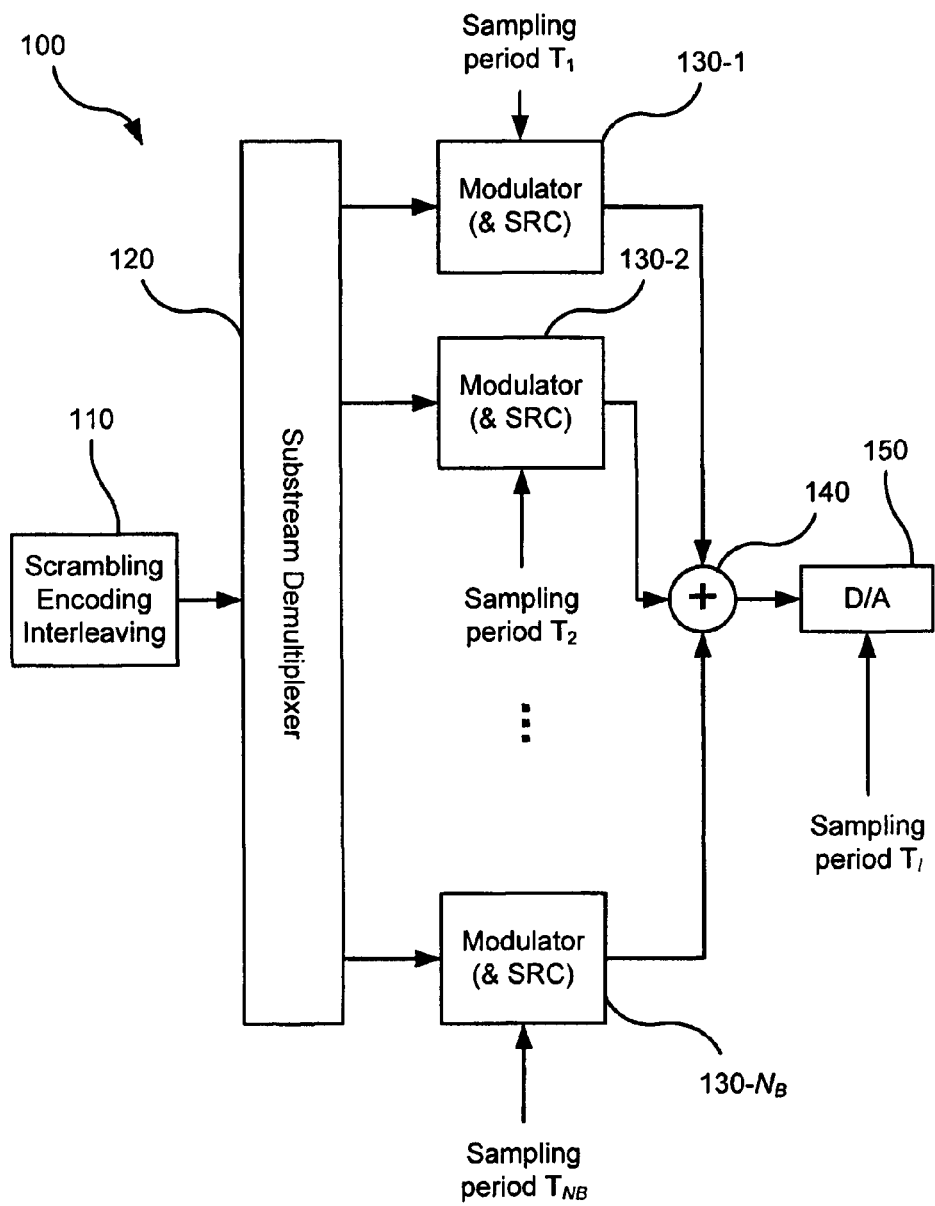
FIG. 1 is a block diagram of a digital sub-system within the transmitter of a communication system, within which the embodiments may be practised.

Where reference is made in any one or more of the accompanying drawings to steps and/or features, which have the same reference numerals, those steps and/or features have for the purposes of this description the same function(s) or operation(s), unless the contrary intention appears.

System Architecture

FIG. 1 is a block diagram of a digital sub-system 100 within the transmitter of a communication system, within which the embodiments may be practised. The digital sub-system 100 comprises a scrambling, encoding and interleaving module 110, which scrambles, encodes (e.g. using forward error codes), and interleaves an input data bit stream. The scrambled, encoded and interleaved bit stream is passed to a substream demultiplexer 120, which divides the bit stream into $N_B$ substreams. Each substream is modulated by a corresponding OFDM modulator 130-$i$ ($i=1, 2, \ldots, N_B$) to generate a digital IF signal in the i-th frequency band associated with the modulator 130-$i$. Each modulator 130-$i$ also includes sample rate conversion, as described in detail below, to up-sample the baseband modulated symbols with a sampling period $T_i$ associated with the corresponding frequency band to baseband modulated symbols at a common sampling period $T_1$ that is less than all the sampling periods $T_i$. The digital IF signals from the modulators 130-$i$ at the common sampling period $T_1$ are combined by a digital combiner 140 and converted by a D/A converter 150 at the common sampling period $T_1$ to a multiband analog IF signal. The multiband analog IF signal is then passed through an RF transmission sub-system (not shown) in which it is up-converted to an RF (radio frequency) signal, amplified, and transmitted. If the communication system is wireless, transmission is through an antenna. Otherwise, transmission could be via another means such as a cable.

Figure 2:
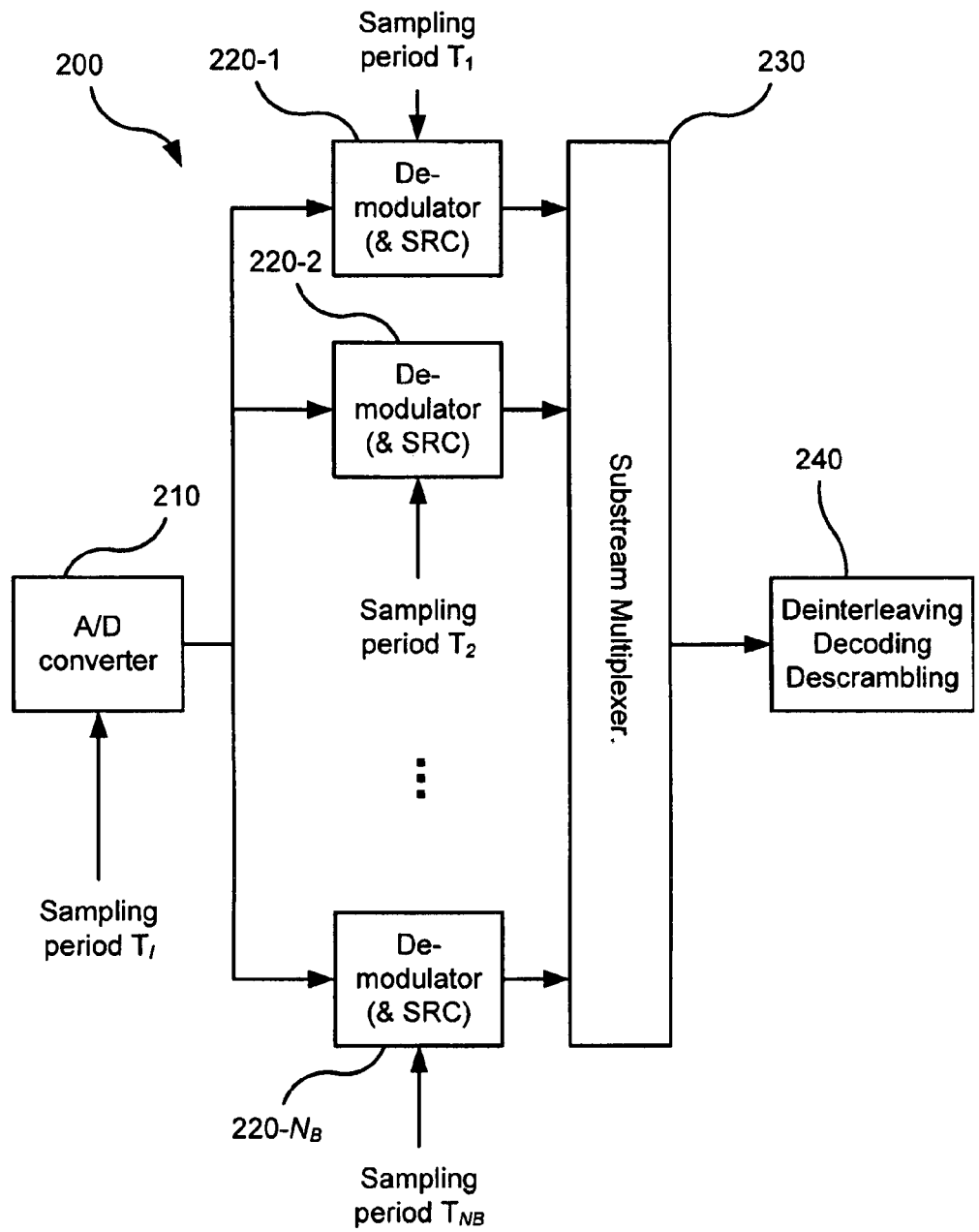
FIG. 2 is a block diagram of a digital sub-system within the receiver of a communication system, within which the embodiments may also be practised.

FIG. 2 is a block diagram of a digital sub-system 200 within the receiver of a communication system, within which the embodiments may also be practised. The receiver is complementary to the transmitter of FIG. 1. The digital sub-system 200 comprises an A/D converter 210 with the sampling period $T_1$ that converts a multiband analog IF signal from an RF receiving sub-system (not shown) to a multiband digital IF signal at the sampling period $T_1$. The multiband digital IF signal is passed to $N_B$ demodulators 220-$i$ ($i=1, 2, \ldots, N_B$), operating respectively in the frequency bands $i=1, \ldots, N_B$ with respective sampling periods $T_i$. Each demodulator 220-$i$ down-converts the signal component corresponding to the i-th frequency band in the multiband digital IF signal to baseband, performs SRC to down-sample the sample rate from the common sampling period $T_1$ to the sampling period $T_i$ associated with the i-th frequency band, and then demodulates a substream of coded data bits from the sample-rate-converted baseband signal. The substream multiplexing module 230 combines the $N_B$ recovered substreams to form a single coded data stream, which is then deinterleaved, decoded and descrambled by a deinterleaving, decoding and descrambling module 240 to recover the original uncoded data bits.

The number $N_B$ of substreams could be as small as one, in which case the digital sub-system 100 is a single-band system. In a single-band system there is no need for a substream demultiplexer 120 or a digital combiner 140 in the digital sub-system 100 of FIG. 1, or a substream multiplexing module 230 in the digital sub-system 200 of FIG. 2.

Figure 3:
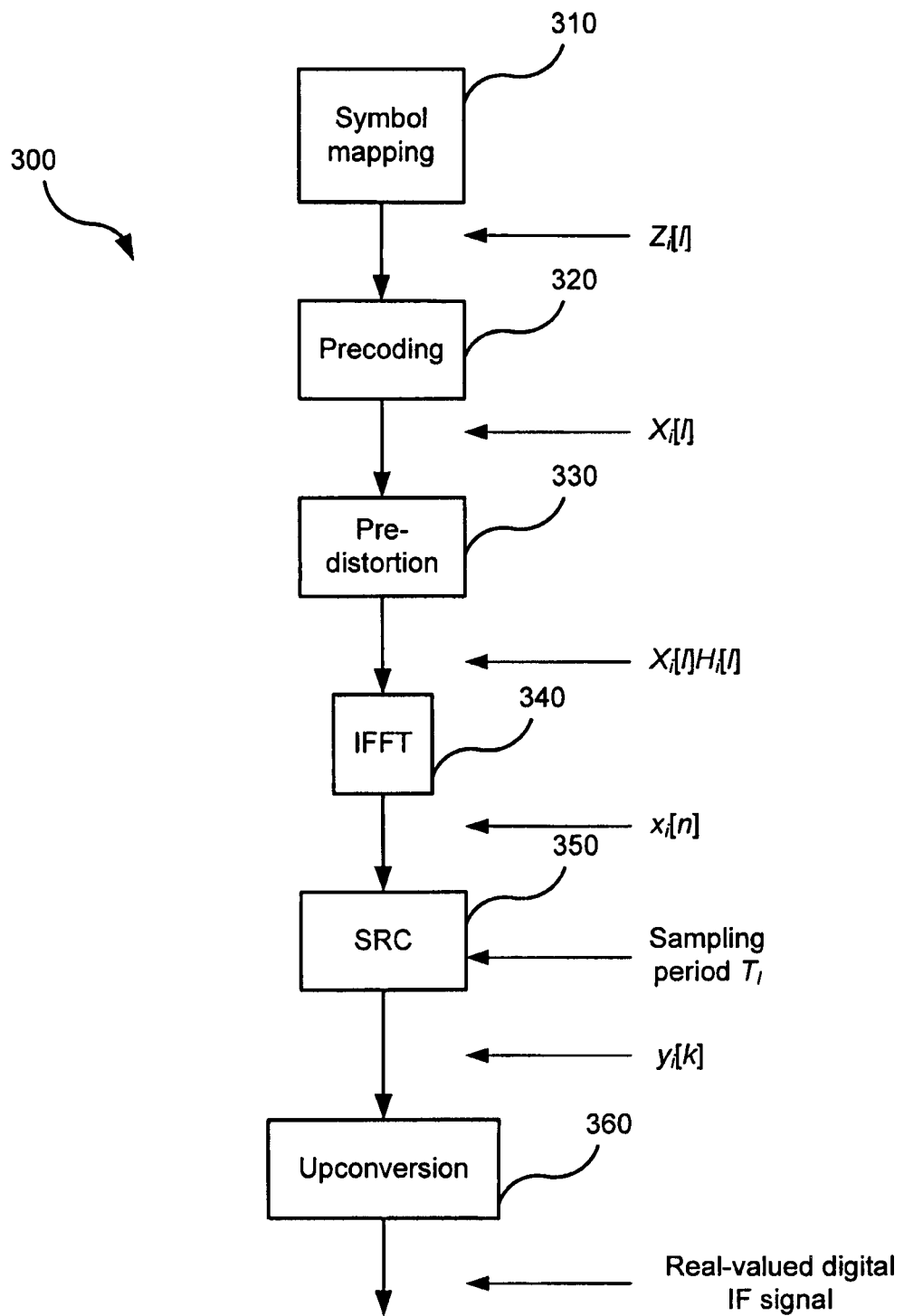
FIG. 3 is a block diagram of an OFDM modulator with SRC, as may be used in the digital sub-system of FIG. 1.

FIG. 3 is a block diagram of an OFDM modulator with SRC 300. The modulator 300 may be used as each of the modulators 130-$i$ in the digital sub-system 100 of FIG. 1. The input data bits from substream $i$ are mapped to symbols $Z_i[l]$ by a symbol mapping module 310, where $l=0, 1, \ldots, N_{FFT}-1$ and $N_{FFT}$ is the number of OFDM sub-carriers. The precoding module 320 performs precoding of the symbols $Z_i[l]$ to reduce possible out-of-band emission. The precoded symbols are denoted as $X_i[l]$.

Because the interpolation for sample rate conversion at a later processing stage in the modulator 300 introduces passband droop, frequency-domain pre-distortion, i.e. the multiplication of $X_i[l]$ by a discrete frequency response $H_i[l]$, is performed by the pre-distortion module 330 in order to compensate for the passband droop. More details on the implementation of the pre-distortion filter $H_i[l]$ are given below. The pre-distorted symbols $X_i[l]H_i[l]$ are passed to an OFDM modulation module 340, in the form of an Inverse Fast Fourier Transform (IFFT) module. The modulation module 340 produces a time-domain baseband OFDM symbol $x_i[n]$, for $n=0, 1, \ldots, N_{FFT}-1$. The sampling period of the OFDM symbol $x_i[n]$ is $$T_i = \frac{1}{\Delta f_i N_{FFT}},$$

where $\Delta f_i$ is the OFDM sub-carrier spacing in the i-th frequency band.

The time-domain OFDM symbol $x_i[n]$ is then passed to a sample rate conversion (SRC) module 350 that converts $x_i[n]$ to a baseband OFDM symbol $y_i[k]$ at the common sampling period $T_1$. The SRC module 350 notionally comprises an interpolation filter with impulse response $r_{T_i}(t)$ that converts $x_i[n]$ into a notional continuous-time signal $x_i(t)$, which is then re-sampled at the common sampling period $T_1$ to obtain $y_i[k]=x_i(kT_1)$. The purpose of the interpolation filter $r_{T_i}(t)$ is to fulfil the anti-imaging and anti-aliasing requirements for SRC. More details on the implementation of the SRC module 350 are given below.

Finally, the sample-rate-converted baseband OFDM symbol $y_i[k]$ is up-converted by an up-conversion module 360 to a real-valued digital IF signal in the i-th frequency band for combining with IF signals from the other OFDM modulators in the digital sub-system 100 into a multiband digital IF signal.

Other types of modulators may be used as each of the modulators 130-$i$ in the digital sub-system 100 of FIG. 1, for example, single-carrier modulators. In a single-carrier modulator there is no precoding module 320, and the modulation module 340 is a single-carrier modulation module.

Figure 4:
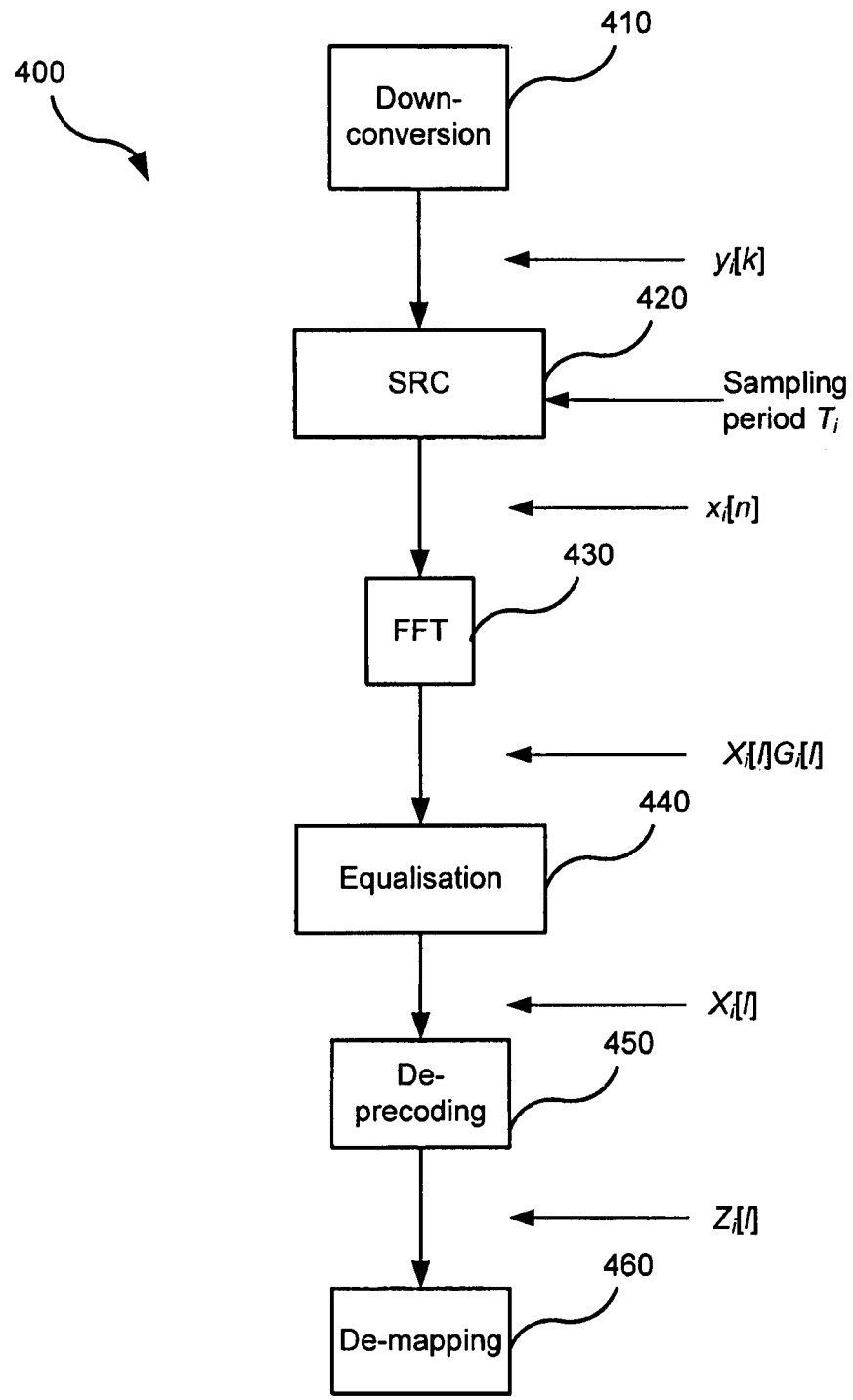
FIG. 4 is a block diagram of an OFDM demodulator with SRC, as may be used in the digital sub-system of FIG. 2.

FIG. 4 is a block diagram of an OFDM demodulator with SRC 400. The demodulator 400 may be used as each of the demodulators 220-$i$ in the digital sub-system 200 of FIG. 2 where the OFDM modulator 300 is in use on the transmit side. In general, the sample rate conversion in the OFDM demodulator 400 is a reverse operation to that in the corresponding OFDM modulator 300. The OFDM demodulator 400 starts with a down-conversion module 410 that down-converts the i-th frequency band of the received multiband digital IF signal with sampling period $T_1$ to a received baseband signal denoted as $y_i[k]$. The received baseband signal $y_i[k]$, also with sampling period $T_1$, is then passed through an SRC module 420 that converts the received baseband signal $y_i[k]$ to a received OFDM symbol $x_i[n]$ at the sampling period $T_i$ of the i-th frequency band. The SRC module 420 notionally comprises an interpolation filter with impulse response $r_{T_i}(t)$ that converts $y_i[k]$ into a notional continuous-time signal $y_i(t)$, which is then re-sampled at the sampling period $T_i$ to obtain $x_i[n]=y_i(nT_i)$. In addition to the rejection of image components of the received baseband signal $y_i[k]$ in the i-th frequency band, the interpolation filter $r_{T_i}(t)$ must also be able to reject signals from other bands. More details on the implementation of the SRC module 420 are given below.

A demodulation module 430, in the form of a Fast Fourier Transform (FFT) module, demodulates the received OFDM symbol $x_i[n]$ to the frequency domain to obtain a received symbol sequence $X_i[l]$. After equalisation by an equalisation module 440 and de-precoding by a de-precoding module 450, the data symbols $Z_i[l]$ are recovered. Finally, the data bits in substream i are retrieved from the data symbols $Z_i[l]$ by a symbol de-mapping module 460.

If the modulators 130-$i$ in the digital sub-system 100 of FIG. 1 are single-carrier modulators, so too are the demodulators 220-$i$ in the digital sub-system 200 of FIG. 2. In a single-carrier demodulator there is no de-precoding module 450, and the demodulation module 430 is a single-carrier demodulation module that is complementary to the single-carrier modulation module 340.

For convenience, the same signal labels as those used in FIG. 3 are used in FIG. 4, but they do not necessarily refer to the same actual signals. For example, $y_i[k]$ in FIG. 4 is the received baseband signal which includes the OFDM signal from the i-th frequency band as well as signal components from other bands, whereas $y_i[k]$ in FIG. 3 is the OFDM signal to be transmitted in the i-th frequency band only. The signal labelled $x_i[n]$ in FIG. 4 is the received OFDM signal with sampling period $T_i$, which has distortion due to passband droop introduced by the SRC module 420 as well as the transmission channel. This distortion will be somewhat compensated by the equalization module 440. However, in FIG. 3, $x_i[n]$ is the pre-distorted OFDM signal with sampling period $T_i$.

Interpolation Filter Design

The frequency spectrum of the precoded data symbols $X_i[l]$ is denoted as $X_i(e^{j2\pi fT_i})$ (with period $1/T_i$), so that $X_i[l]=X_i(e^{j2\pi l\Delta f_iT_i})$, $l=0, 1, \ldots, N_{FFT}-1$. Also, the frequency response of the interpolation filter $r_{T_i}(t)$ is denoted as $R_{T_i}(f)$. Because the periodic spectrum $X_i(e^{j2\pi fT_i})$ comprises image components spaced at $1/T_i$ and the re-sampling after interpolation will cause spectrum aliasing in the i-th frequency band, the interpolation filter $R_{T_i}(f)$ is chosen so that both anti-imaging and anti-aliasing requirements are met. A suitable interpolation filter $R_{T_i}(f)$ which satisfies these requirements is $$R_{T_i}(f) = \left(T_i \frac{\sin\pi fT_i}{\pi fT_i}e^{-j\pi fT_i}\right)^L \tag{1}$$

which is the product of L sinc functions.

Figure 5:
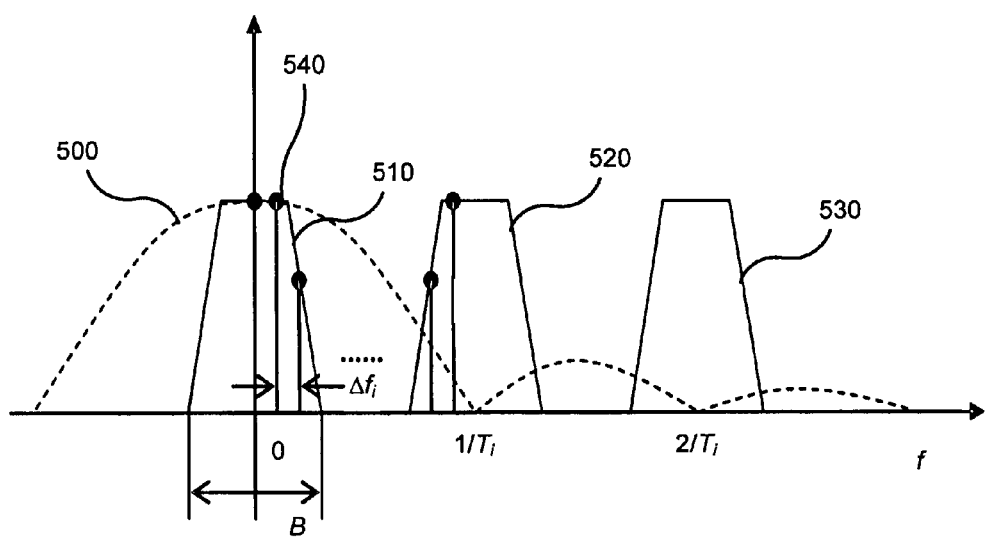
FIG. 5 illustrates the design of the interpolation filter for use in the SRC module in the OFDM modulator of FIG. 3.

FIG. 5 illustrates the frequency response 500 of the interpolation filter $R_{T_i}(f)$ of equation (1) for use in the SRC module 350 in the OFDM modulator 300 of FIG. 3. FIG. 5 also illustrates the main lobe 510 of $X_i(e^{j2\pi fT_i})$, with bandwidth B, two of its image components 520, 530 centred at multiples of $1/T_i$, and its $N_{FFT}$ samples $X_i[l]$ spaced at $\Delta f_i=1/N_{FFT}T_i$. As shown in FIG. 5, the sinc function is naturally able to reject the image components 520, 530 of $X_i(e^{j2\pi fT_i})$ since the nulls of the sine spectrum at multiples of $1/T_i$ coincide with the centres of the image components 520, 530. The spectrum of $R_{T_i}(f)$ 500 rolls off in the order of $f^{-L}$, so the interpolation filter $R_{T_i}(f)$ of equation (1) also offers good anti-aliasing capability when a sufficiently large order L is selected.

However, the interpolation filter $R_{T_i}(f)$ of equation (1) also introduces passband droop. That is, the magnitude of $X_i[l]$ is attenuated more towards the two edges of the main lobe 510 than at the centre of the main lobe 510 after interpolation (equivalent to multiplication by $R_{T_i}(f)$). The pre-distortion module 330 in the OFDM modulator 300 compensates for this passband droop by multiplying $X_i[l]$ by a discrete frequency response $H_i[l]$ that inverts the baseband frequency response of the interpolation filter. The frequency response $H_i[l]$ is given by $$H_i[l] = \begin{cases} \dfrac{1}{R_{T_i}(l\Delta f_i)}, & \text{for } l=0, 1, \ldots, \dfrac{N_{FFT}}{2}-1 \\ \dfrac{1}{R_{T_i}((l-N_{FFT})\Delta f_i)}, & \text{for } l=\dfrac{N_{FFT}}{2}, \dfrac{N_{FFT}}{2}+1, \ldots, N_{FFT}-1 \end{cases} \tag{2}$$

For the OFDM demodulator 400 of FIG. 4, the sample rate at digital IF, $1/T_1$, is much higher than the signal bandwidth B. In order to provide sufficient anti-aliasing ability and also reject possible unwanted signal components in addition to the image components of the baseband signal in the i-th frequency band from the received and down-converted signal $y_i[k]$ (whose frequency response is denoted as $Y_i(e^{j2\pi fT_i})$), the interpolation filter $r_{T_i}(t)$ of the SRC module 420 should have multiple nulls in a frequency band which has a bandwidth equal to the sample rate $1/T_1$. An interpolation filter $R_{T_i}(f)$ satisfying this requirement is also a sinc-product:

$$R_{T_i}(f) = \left(NT_1 \frac{\sin\pi fNT_1}{\pi fNT_1}e^{-j\pi fNT_1}\right)^M \tag{3}$$

where M is a positive integer denoting the order of the interpolation filter $R_{T_i}(f)$, and N is the number of nulls, spaced at $1/NT_1$, of $R_{T_i}(f)$ within the sample rate $1/T_1$. When M and N are properly selected, both the image components of the baseband signal in the i-th frequency band and the unwanted components in other bands can be rejected after interpolation.

Figure 6:
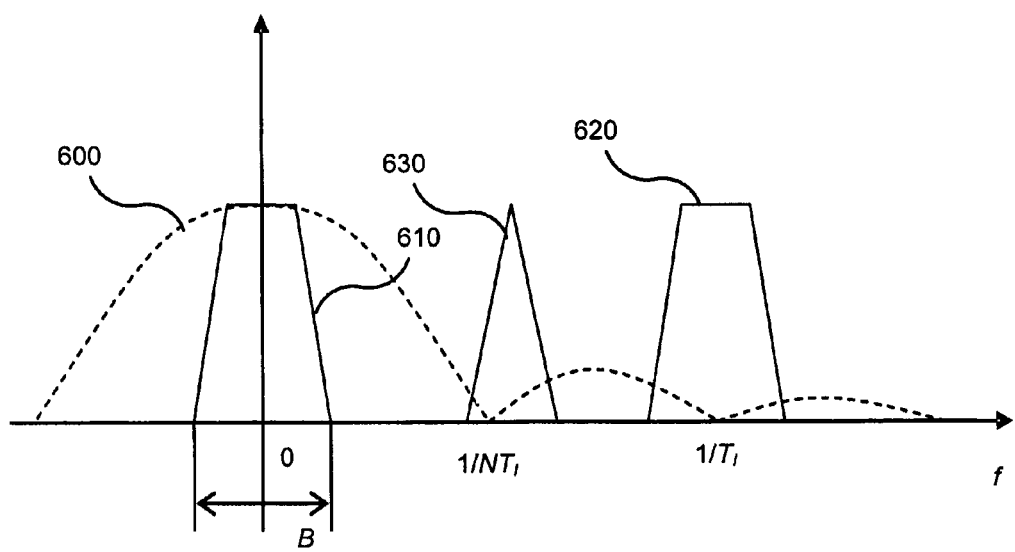
FIG. 6 illustrates the design of the interpolation filter for use in the SRC module in the OFDM demodulator of FIG. 4.

FIG. 6 illustrates the interpolation filter $R_{T_i}(f)$ 600 of equation (3) for use in the SRC module 420 in the OFDM demodulator 400 of FIG. 4, with N set to 2. FIG. 6 also illustrates the main lobe 610 of $Y_i(e^{j2\pi fT_i})$, with bandwidth B, one of its image components 620, which are centred at multiples of $1/T_1$, and an unwanted signal component 630. The interpolation filter $R_{T_i}(f)$ 600 has N=2 nulls within the sample rate $1/T_1$, spaced at $1/NT_1$. The null of $R_{T_i}(f)$ at $1/T_1$ coincides with the first image component 620 of $X_i(e^{j2\pi fT_i})$. The null at $1/NT_1$ approximately coincides with the unwanted component 630.

The interpolation filter $R_{T_i}(f)$ according to equation (3) will also introduce passband droop to the wanted signal $Y_i(e^{j2\pi fT_i})$. This passband droop, and any distortion introduced by the transmission channel, is compensated by the frequency-domain equalization module 440 in the OFDM demodulator 400.

Note that for a sinc frequency response of the form $$T\frac{\sin\pi fT}{\pi fT}e^{-j\pi fT},$$

the time-domain impulse response is a rectangular pulse of width T, called the gate function $g_T(t)$, and defined by $$g_T(t) = \begin{cases} 1, & 0 \le t < T \\ 0, & \text{otherwise} \end{cases} \tag{4}$$

The product of P+1 such sinc frequency responses has a time-domain impulse response which is the convolution of P+1 gate functions. This repeated convolution of P+1 gate functions is defined as the P-th order causal B-spline, denoted as $$\beta_T^{(P)}(t) = \underbrace{g_T(t) * \ldots * g_T(t)}_{P+1} \quad (5)$$

The interpolation filters $r_{T_i}(t)$ and $r_{T_1}(t)$ in the SRC modules 350 and 420 respectively, as defined by equations (1) and (3), may therefore be written as $\beta_{T_i}^{(L-1)}(t)$ and $\beta_{NT_1}^{(M-1)}(t)$ respectively.

Figure 7:
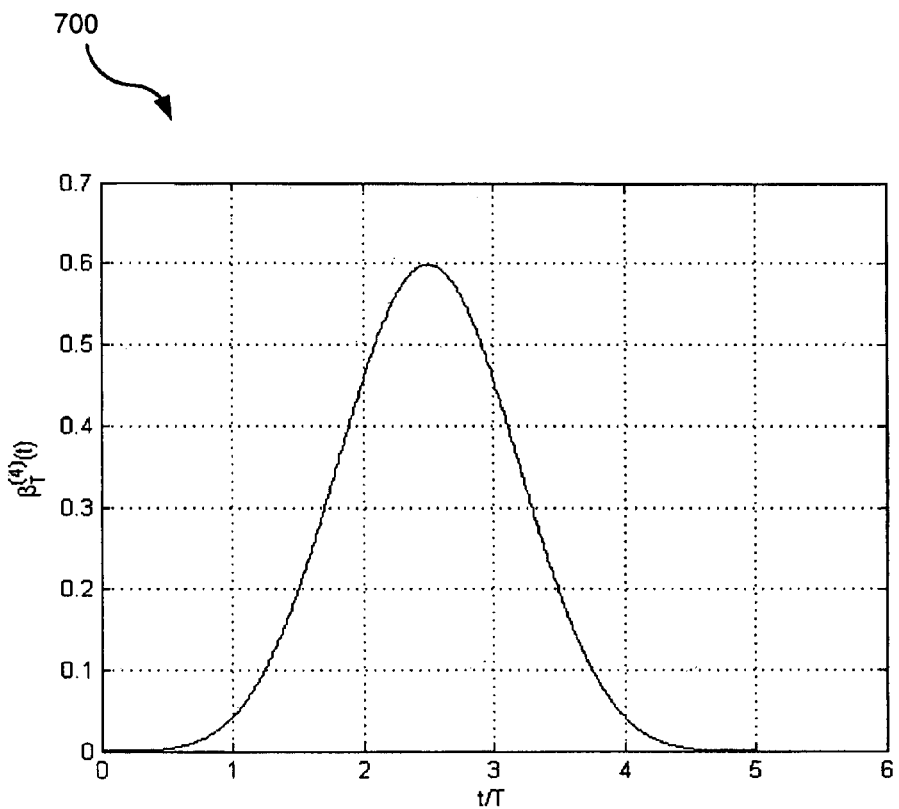
FIG. 7 illustrates a causal B-spline of order 4.

The causal B-spline defined in equation (5) is a piecewise continuous function of t with pulse duration (P+1)T. An example 700 of the causal B-spline with order P=4 is illustrated in FIG. 7. Each piece of the causal B-spline is a P-th order polynomial in t with duration T. Suppose that the sampling period of a signal sequence to be sample-rate-converted is also T. If B-spline-based SRC is to be implemented directly, a set of P+1 samples of $\beta_T^{(P)}(t)$ must be calculated and convolved with the input sequence to generate each output sample. Each sample of $\beta_T^{(P)}(t)$ is a sum of up to P+1 terms, each term being a power of t. Direct implementation of B-spline-based SRC, like other polynomial-based SRC, is therefore inefficient.

Implementing Devices

Disclosed below are devices configured to implement causal B-spline-based sample rate conversion of an input signal by an arbitrary ratio. The disclosed devices may be used as the SRC modules 350 and 420 by appropriately setting the input and output sampling periods and the duration and order of the causal B-spline.

In the following, the input signal sequence with sampling period T to be sample-rate-converted is denoted as x(nT), the interpolated continuous-time signal as x(t), and the sample-rate-converted output signal sequence with sampling period T' as x(kT').

First, a device to implement sample rate conversion of x(nT) using the causal B-spline $\beta_T^{(P)}(t)$ (single-width B-spline-based SRC) is described. The disclosed device is based on the decomposition of $\beta_T^{(P)}(t)$ into a sum of P+1 normalized power functions $$\left(\frac{t}{T}\right)^p g_T(t),$$

p=0, 1, . . . , P. The decomposition exploits the following property of the convolution between $$\left(\frac{t}{T}\right)^{p-1} g_T(t)$$

and $g_T(t)$:

$$\left(\frac{t}{T}\right)^{p-1} g_T(t) * g_T(t) = \frac{T}{p}\left[(1 - D_T)\left(\frac{t}{T}\right)^p g_T(t) + D_T g_T(t)\right] \quad (6)$$

where $D_T$ denotes an operator which delays a function of t by T. Starting from the zero-order B-spline $\beta_T^{(0)}(t) = g_T(t)$, the first and second order B-splines can be decomposed as $$\beta_T^{(1)}(t) = \beta_T^{(0)}(t) * g_T(t) = T\left[(1 - D_T)\frac{t}{T}g_T(t) + D_T g_T(t)\right] \quad (7)$$

using equation (6) with p=1, and $$\beta_T^{(2)}(t) = \beta_T^{(1)}(t) * g_T(t) = T^2\left\{(1 - D_T) \cdot \frac{1}{2} \cdot (1 - D_T) \cdot \left(\frac{t}{T}\right)^2 g_T(t) + D_T \cdot (1 - D_T) \cdot \frac{t}{T} g_T(t) + \left[D_T \cdot D_T + (1 - D_T) \cdot \frac{1}{2} \cdot D_T\right] g_T(t)\right\} \quad (8)$$

using equation (7) and equation (6) with p=2.

The above decomposition process can be continued until the P-th order B-spline is expressed as a sum of the P+1 normalized power functions $$\left(\frac{t}{T}\right)^p g_T(t),$$

p=0, . . . , P, each of which is multiplied by a composite operator composed of a series of $D_T$ and $1-D_T$.

To reconstruct the signal x(t) using the decomposed P-th order B-spline, each composite operator is applied to the input sequence x(nT), with the operator $D_T$ implemented by a delay element $z^{-1}$ and the operator $1-D_T$ by a delay-difference element $1-z^{-1}$. The resulting intermediate sequence, denoted as $v_p(nT)$, is then convolved with the corresponding normalized power function. The interpolated signal x(t) may therefore be written as $$x(t) = \sum_{p=0}^{P} v_P(nT) * \left(\frac{t}{T}\right)^p g_T(t) \quad (9)$$

The P+1 intermediate sequences $v_p(nT)$, collectively denoted as a state vector $v(nT) = [v_0(nT), v_1(nT), \ldots, v_p(nT)]$, can be efficiently obtained through a discrete delay and difference network according to the above decomposition process. The number of multiplications required in the (P+1)-output delay and difference network is only (P−1)P/2.

Since each intermediate sequence $v_p(nT)$ from the delay and difference network has sampling period T, and the duration of the corresponding normalized power function $$\left(\frac{t}{T}\right)^p g_T(t)$$

is also T, the interpolated signal x(t) in the interval [nT,(n+1)T) is given by $$x(t) = \sum_{p=0}^{P} v_P(nT)\left(\frac{t - nT}{T}\right)^p g_T(t - nT) \quad (10)$$

without any overlapping of adjacent normalized power functions.

To re-sample the interpolated signal x(t) at sampling period T' to produce the k-th output sample x(kT'), first define the k-th integer index m(k) and the k-th fractional interval, μ(k) ∈[0,1] as follows:

$$kT' = [m(k) + \mu(k)]T \quad (11)$$

Using the terms defined in equation (11), the re-sampling of x(t) at sampling period T' according to equation (10) becomes $$x(kT') = \sum_{p=0}^{P} (m(k)T)(\mu(k))^p \qquad (12)$$

Equation (12) has an equivalent, nested form $$x(kT') = \underbrace{((\ldots(v_P(m(k)T)\mu(k) + \ldots v_1(m(k)T))\mu(k) + v_0(m(k)T)}_{P} \qquad (13)$$

which comprises the P-fold iteration of a primitive comprising a multiplication of the intermediate sequence $v_p(m(k)T)$ by $\mu(k)$ followed by an addition of the next intermediate sequence $v_{p-1}(m(k)T)$. Thus the total number of multiplications required to implement Equation (13) is (P+1)P/2, which is half the (P+1)P multiplications in the conventional Farrow structure.

Figure 8:
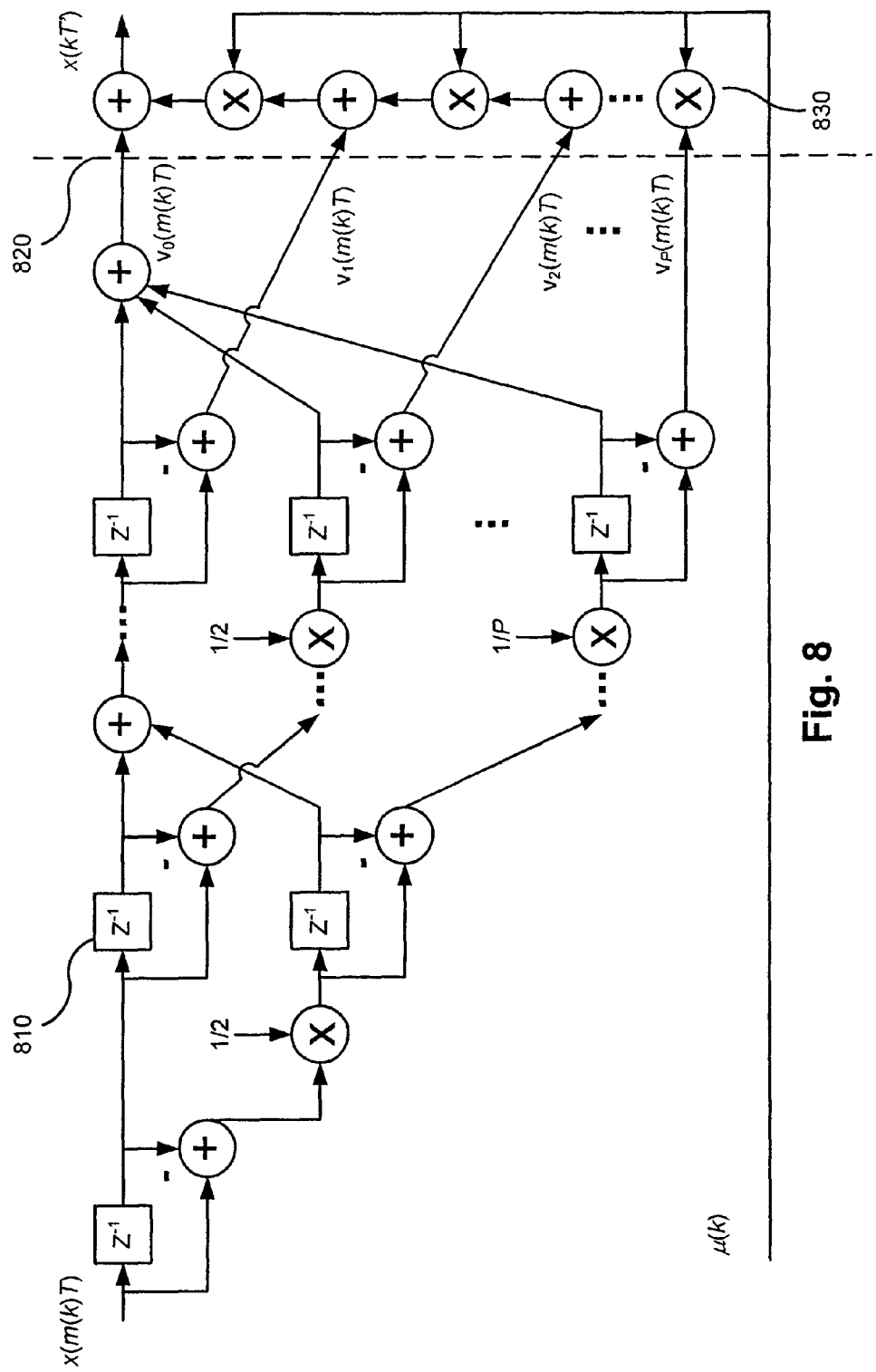
FIG. 8 illustrates a device for B-spline-based sample rate conversion, that may be used as the SRC module in the OFDM modulator of FIG. 3.

FIG. 8 illustrates a device 800 for single-width causal-B-spline-based sample rate conversion, based on Equation (13). The SRC device 800 may be used as the SRC module 350 in the OFDM modulator 300 of FIG. 3 by setting $T=T_i$, $T'=T_1$, and P=L−1. The value of L depends on the stopband attenuation requirement. For example, if 50 dB attenuation is required, L is set to 5. Each element marked "z−1", e.g. 810, implements the delay operator $D_T$ used in equation (6) to define the intermediate sequences $v_p(nT)$. To the left of the vertical line 820 lies the discrete delay and difference network used to produce the intermediate sequences $v_p(nT)$. To the right of the vertical line 820 is a ladder structure 830 comprising successive multiplication-addition elements that implement the nested structure of equation (13).

The index m(k) and the fractional interval μ(k) are both initialised to 0 for k=0, then iteratively updated for each successive value of k as follows:

$$m(k+1) = m(k) + \text{floor}\left(\mu(k) + \frac{T'}{T}\right) \qquad (14)$$

$$\mu(k+1) = \mu(k) + \frac{T'}{T} - \text{floor}\left(\mu(k) + \frac{T'}{T}\right) \qquad (15)$$

Now, a device to implement sample rate conversion of the input sequence x(nT) to an output sampling period of T' using the causal B-spline $\beta_{NT}^{(P)}(t)$ (multi-width B-spline-based SRC) is described.

Following the same procedure as described above, the causal B-spline $\beta_{NT}^{(P)}(t)$ can be decomposed into a sum of P+1 normalized power functions $$\left(\frac{t}{NT}\right)^p g_{NT}(t),$$

p=0, 1, ..., P. Since these normalized power functions have pulse duration NT, whereas the input sequence x(nT) has a sampling period T, the contribution to the interpolated signal x(t) by each normalized power function $$\left(\frac{t}{NT}\right)^p g_{NT}(t)$$

in the interval [nT, (n+1)T] will be a sum of N overlapped normalized power functions, i.e.

$$x(t) = \sum_{p=0}^{P} \sum_{i=0}^{N-1} v_p(nT - iT)\left(\frac{t + iT - nT}{NT}\right)^p g_{NT}(t + iT - nT), \qquad (16)$$

$$t \in [nT, (n+1)T]$$

where $v_p(nT)$ is the p-th element of the state vector v(nT) obtained by a delay and difference network similar to that illustrated in FIG. 8, but with N-sample delay elements $z^{-N}$ and delay-and-difference elements $1-z^{-N}$.

Using the terms defined in equation (11), the re-sampling of the interpolated signal x(t) at sampling period T' according to equation (16) becomes $$x(kT') = \sum_{i=0}^{N-1} \sum_{p=0}^{P} v_p((m(k)-i)T)\left(\frac{\mu(k)+i}{N}\right)^p \qquad (17)$$

The k-th sample x(kT') may then be calculated, by analogy with the nested equation (13) above, as $$x(kT') = \qquad (18)$$

$$\sum_{i=0}^{N-1} \left\{ \underbrace{((\ldots(v_P((m(k)-i)T)\frac{\mu(k)+i}{N} + \ldots v_1((m(k)-i)T))\frac{\mu(k)+i}{N}}_{P} + \right.$$

$$\left. v_0((m(k)-i)T) \right\}$$

Figure 9:
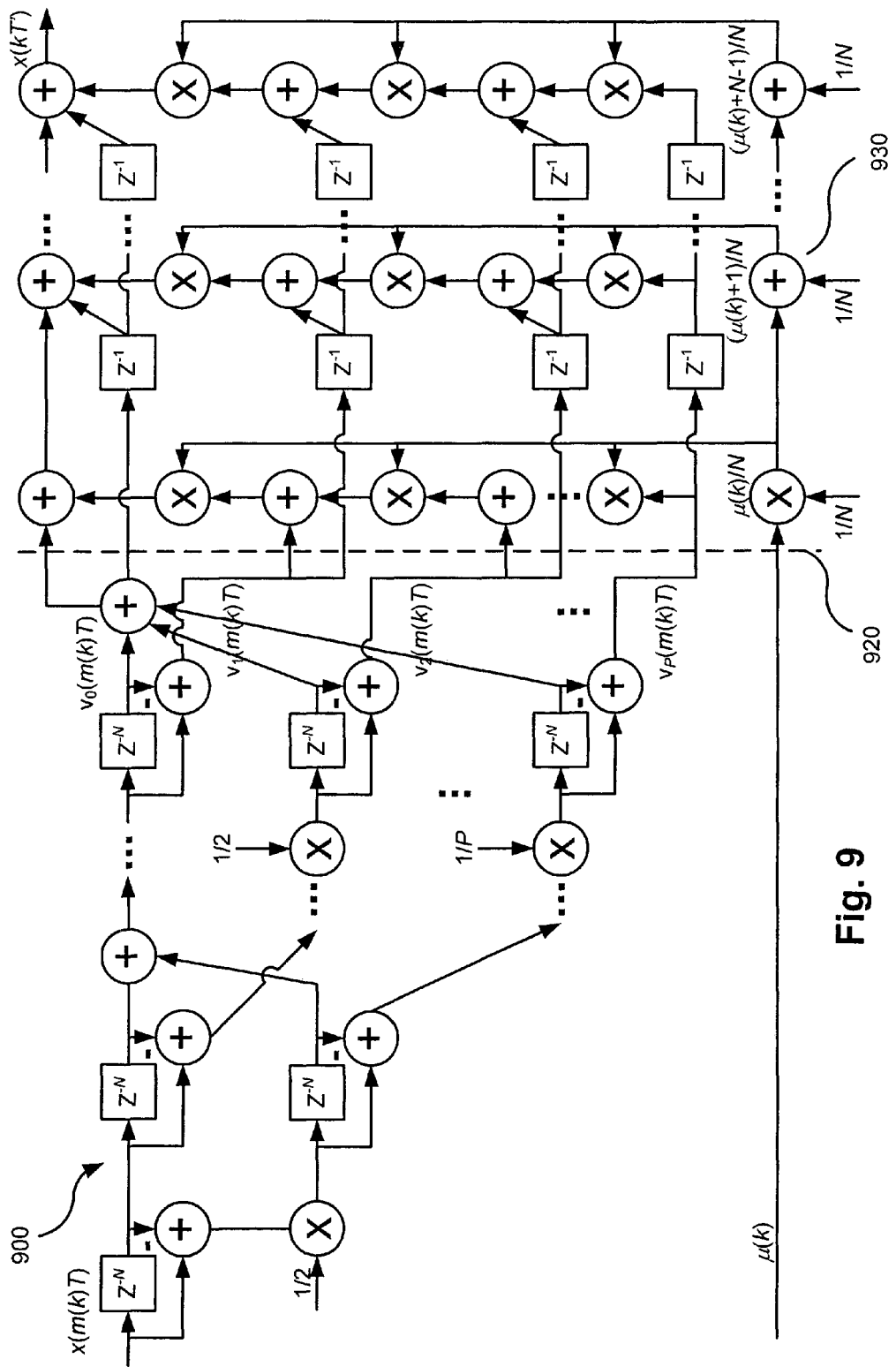
FIG. 9 illustrates a device for B-spline-based sample rate conversion, that may be used as the SRC module in the OFDM demodulator of FIG. 4.

FIG. 9 illustrates an device 900 for multi-width causal B-spline-based sample rate conversion, based on Equation (18). The SRC device 900 may be used as the SRC module 420 in the OFDM demodulator 400 of FIG. 4 by setting $T=T_1$, $T'=T_i$, P=M−1, and an appropriate N. The values of M and N depend on how many unwanted signal components need to be nulled and the stopband attenuation requirement. For example, if the IF image signal component is to be nulled and the required stopband attenuation is 50 dB, the chosen values are N=2 and M=4. The SRC device 800 is a special case of the device 900, with N set to 1.

To the left of the vertical line 920 lies the discrete delay and difference network used to derive the intermediate sequences $v_p(nT)$, which is the same as the delay and difference network in the device 800 of FIG. 8, but with the delay elements $z^{-1}$ replaced by N-sample delay elements $z^{-N}$. To the right of the vertical line 920 are N ladder structures, e.g. 930, comprising successive multiplication-addition elements that implement the nested structure of the summed terms in equation (18). The outputs of the N ladder structures are added together to produce the output sequence x(kT').

Figure 10A:
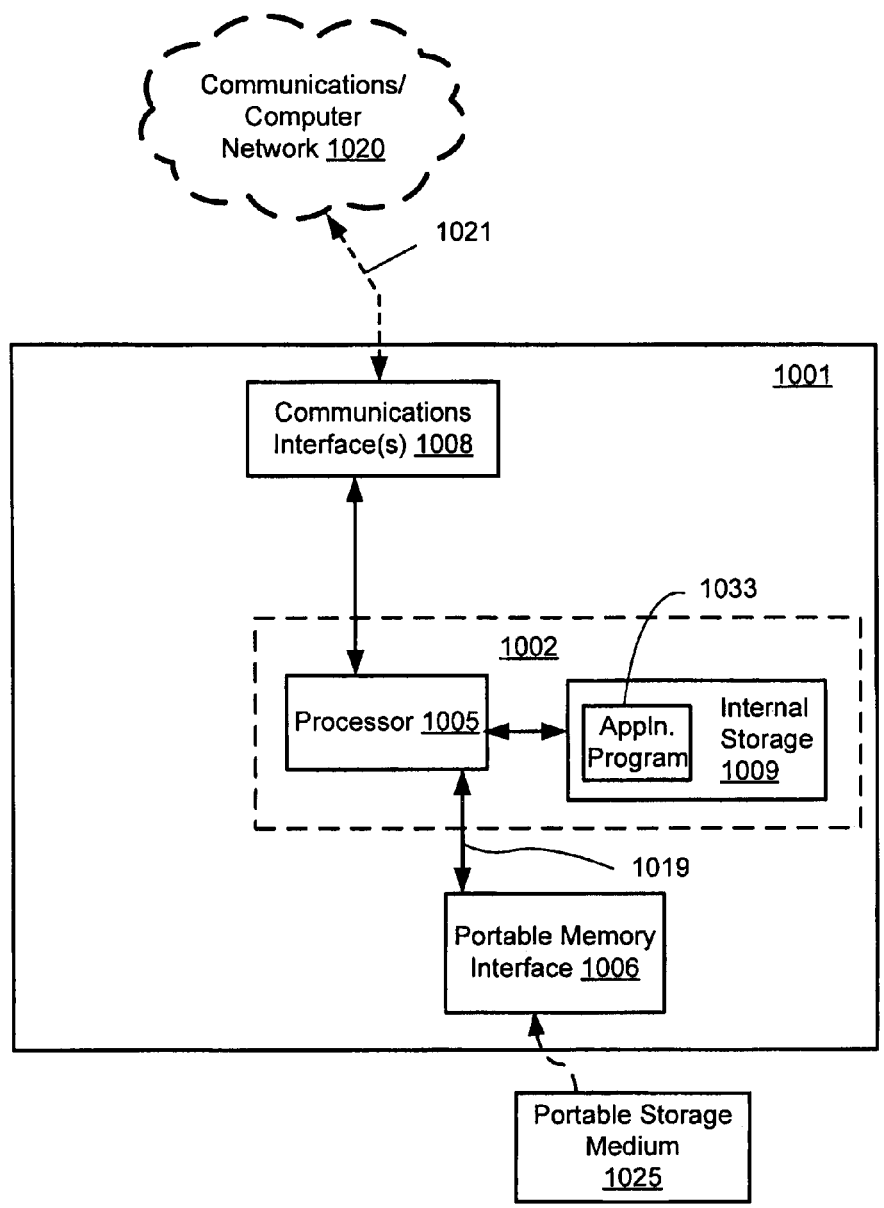
FIGS. 10A and 10B collectively form a schematic block diagram representation of an embedded computing device in which the SRC modules of FIGS. 3 and 4 may alternatively be implemented.
Figure 10B:
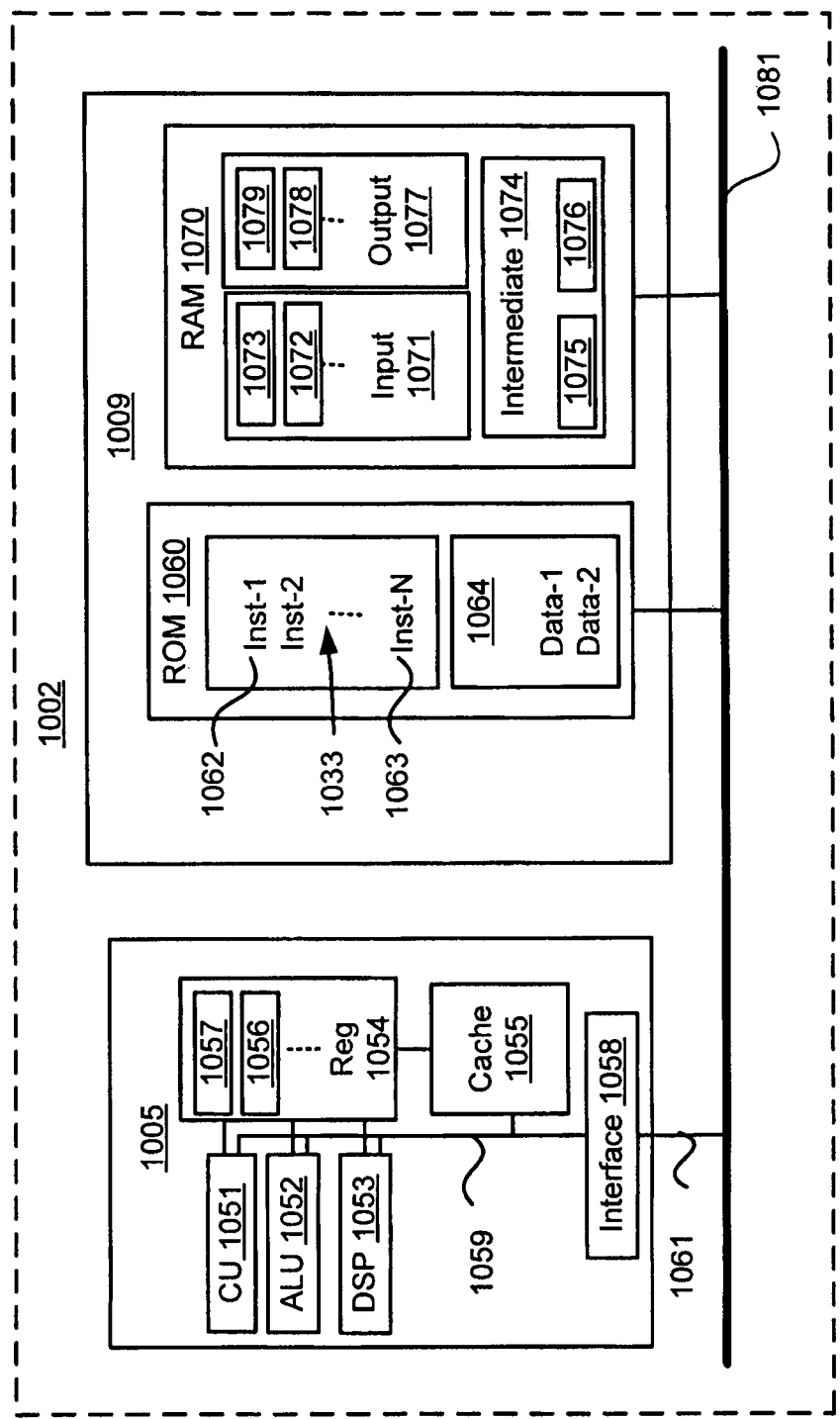

FIGS. 10A and 10B collectively form a schematic block diagram of an embedded computing device 1001, in which the SRC modules 350 and 420 may alternatively be implemented. As seen in FIG. 10A, the electronic device 1001 comprises an embedded controller 1002. Accordingly, the electronic device 1001 may be referred to as an "embedded device." The controller 1002 has a processing unit (or processor) 1005 which is bi-directionally coupled to an internal storage module 1009. The storage module 1009 may be formed from non-volatile semiconductor read only memory (ROM) 1060 and semiconductor random access memory (RAM) 1070, as seen in FIG. 10B. The RAM 1070 may be volatile, non-volatile or a combination of volatile and non-volatile memory.

As seen in FIG. 10A, the electronic device 1001 also comprises a portable memory interface 1006, which is coupled to the processor 1005 via a connection 1019. The portable memory interface 1006 allows a complementary portable computer readable storage medium 1025 to be coupled to the electronic device 1001 to act as a source or destination of data or to supplement the internal storage module 1009. Examples of such interfaces permit coupling with portable computer readable storage media such as Universal Serial Bus (USB) memory devices, Secure Digital (SD) cards, Personal Computer Memory Card International Association (PCMIA) cards, optical disks and magnetic disks.

The electronic device 1001 also has a communications interface 1008 to permit coupling of the electronic device 1001 to a computer or communications network 1020 via a connection 1021. The connection 1021 may be wired or wireless. For example, the connection 1021 may be radio frequency or optical. An example of a wired connection includes Ethernet. Further, an example of wireless connection includes Bluetooth™ type local interconnection, Wi-Fi (including protocols based on the standards of the IEEE 802.11 family), Infrared Data Association (IrDa) and the like.

The methods described hereinafter may be implemented using the embedded controller 1002, as one or more software application programs 1033 executable within the embedded controller 1002. In particular, with reference to FIG. 10B, the steps of the described methods are effected by instructions in the software 1033 that are carried out within the embedded controller 1002. The software instructions may be formed as one or more code modules, each for performing one or more particular tasks.

The software 1033 of the embedded controller 1002 is typically stored in the non-volatile ROM 1060 of the internal storage module 1009. The software 1033 stored in the ROM 1060 can be updated when required from a computer readable medium. The software 1033 can be loaded into and executed by the processor 1005. In some instances, the processor 1005 may execute software instructions that are located in RAM 1070. Software instructions may be loaded into the RAM 1070 by the processor 1005 initiating a copy of one or more code modules from ROM 1060 into RAM 1070. Alternatively, the software instructions of one or more code modules may be pre-installed in a non-volatile region of RAM 1070 by a manufacturer. After one or more code modules have been located in RAM 1070, the processor 1005 may execute software instructions of the one or more code modules.

The application program 1033 is typically pre-installed and stored in the ROM 1060 by a manufacturer, prior to distribution of the electronic device 1001. However, in some instances, the application programs 1033 may be supplied to the user encoded on the computer readable storage medium 1025 and read via the portable memory interface 1006 of FIG. 10A prior to storage in the internal storage module 1009. "Computer readable storage medium" refers to any non-transitory tangible storage medium that participates in providing instructions and/or data to the embedded controller 1002 for execution and/or processing. Examples of such storage media include floppy disks, magnetic tape, CD-ROM, DVD, a hard disk drive, a ROM or integrated circuit, USB memory, a magneto-optical disk, semiconductor memory, or a computer readable card such as a PCMCIA card and the like, whether or not such devices are internal or external to the electronic device 1001. A computer readable storage medium having such software or computer program recorded on it is a computer program product. The use of such a computer program product in the electronic device 1001 effects a device for sample rate conversion.

In another alternative, the software application program 1033 may be read by the processor 1005 from the network 1020, or loaded into the embedded controller 1002 from other computer readable transmission media. Examples of transitory or non-tangible computer readable transmission media that may also participate in the provision of software, application programs, instructions and/or data to the electronic device 1001 include radio or infra-red transmission channels as well as a network connection to another computer or networked device, and the Internet or Intranets including e-mail transmissions and information recorded on Websites and the like.

FIG. 10B illustrates in detail the embedded controller 1002 having the processor 1005 for executing the application programs 1033 and the internal storage 1009. The internal storage 1009 comprises read only memory (ROM) 1060 and random access memory (RAM) 1070. The processor 1005 is able to execute the application programs 1033 stored in one or both of the connected memories 1060 and 1070. When the electronic device 1001 is initially powered up, a system program resident in the ROM 1060 is executed. The application program 1033 permanently stored in the ROM 1060 is sometimes referred to as "firmware". Execution of the firmware by the processor 1005 may fulfil various functions, including processor management, memory management, device management, storage management and user interface.

The processor 1005 typically includes a number of functional modules including a control unit (CU) 1051, an arithmetic logic unit (ALU) 1052 and a local or internal memory comprising a set of registers 1054 which typically contain atomic data elements 1056, 1057, along with internal buffer or cache memory 1055. One or more internal buses 1059 interconnect these functional modules. The processor 1005 typically also has one or more interfaces 1058 for communicating with external devices via system bus 1081, using a connection 1061.

The application program 1033 includes a sequence of instructions 1062 though 1063 that may include conditional branch and loop instructions. The program 1033 may also include data, which is used in execution of the program 1033. This data may be stored as part of the instruction or in a separate location 1064 within the ROM 1060 or RAM 1070.

In general, the processor 1005 is given a set of instructions, which are executed therein. This set of instructions may be organised into blocks, which perform specific tasks or handle specific events that occur in the electronic device 1001. Typically, the application program 1033 waits for events and subsequently executes the block of code associated with that event. Events may be triggered in response to input from a user, via the user input devices 1013 of FIG. 10A, as detected by the processor 1005. Events may also be triggered in response to other sensors and interfaces in the electronic device 1001.

The execution of a set of the instructions may require numeric variables to be read and modified. Such numeric variables are stored in the RAM 1070. The disclosed method uses input variables 1071 that are stored in known locations 1072, 1073 in the memory 1070. The input variables 1071 are processed to produce output variables 1077 that are stored in known locations 1078, 1079 in the memory 1070. Intermediate variables 1074 may be stored in additional memory locations in locations 1075, 1076 of the memory 1070. Alternatively, some intermediate variables may only exist in the registers 1054 of the processor 1005.

The execution of a sequence of instructions is achieved in the processor 1005 by repeated application of a fetch-execute cycle. The control unit 1051 of the processor 1005 maintains a register called the program counter, which contains the address in ROM 1060 or RAM 1070 of the next instruction to be executed. At the start of the fetch execute cycle, the contents of the memory address indexed by the program counter is loaded into the control unit 1051. The instruction thus loaded controls the subsequent operation of the processor 1005, causing for example, data to be loaded from ROM memory 1060 into processor registers 1054, the contents of a register to be arithmetically combined with the contents of another register, the contents of a register to be written to the location stored in another register and so on. At the end of the fetch execute cycle the program counter is updated to point to the next instruction in the system program code. Depending on the instruction just executed this may involve incrementing the address contained in the program counter or loading the program counter with a new address in order to achieve a branch operation.

Each step or sub-process in the processes of the methods described below is associated with one or more segments of the application program 1033, and is performed by repeated execution of a fetch-execute cycle in the processor 1005 or similar programmatic operation of other independent processor blocks in the electronic device 1001.

The arrangements described are applicable to the digital communication industries.

The foregoing describes only some embodiments of the present invention, and modifications and/or changes can be made thereto without departing from the scope and spirit of the invention, the embodiments being illustrative and not restrictive.

The invention claimed is:

1. A communication modulator with sample rate conversion, the modulator comprising:
 a symbol mapping module configured to map an input bitstream to a symbol sequence;
 a pre-distortion module configured to multiply the symbol sequence by a discrete frequency response to produce a pre-distorted symbol sequence and to invert a baseband frequency response of an interpolation filter;
 a modulation module configured to modulate the pre-distorted symbol sequence to a time-domain baseband sample sequence;
 a sample rate conversion module that includes the interpolation filter having the baseband frequency response with the sample rate conversion module configured to convert the sample rate of the baseband sample sequence to a different sample rate to produce a sample-rate-converted baseband sample sequence; and
 an up-conversion module configured to up-convert the sample-rate-converted baseband sample sequence to an intermediate frequency signal;
 wherein the discrete frequency response by which the pre-distortion module multiplies the symbol sequence is configured to compensate for passband droop introduced to the sample-rate-converted baseband sample sequence by the sample rate conversion module.

2. A modulator according to claim 1, wherein the modulation module includes an Inverse Fast Fourier Transform module and the baseband sample sequence is a sequence of Orthogonal Frequency Division Multiplexing (OFDM) symbols.

3. A modulator according to claim 1, wherein the sample rate conversion module uses a causal B-spline interpolation filter whose frequency response is a product of one or more sinc functions, each sinc function having nulls at integer multiples of the sampling frequency of the baseband sample sequence.

4. A method of modulating a symbol sequence, the method comprising:
 multiplying the symbol sequence by a discrete frequency response to produce a pre-distorted symbol sequence;
 inverting a baseband frequency response of an interpolation filter by the discrete frequency response that is multiplied by the symbol sequence;
 modulating the pre-distorted symbol sequence to a time-domain baseband sample sequence;
 converting the sample rate of the baseband sample sequence of the interpolation filter to a different sample rate to produce a sample-rate-converted baseband sample sequence; and
 up-converting the sample-rate-converted baseband sample sequence to an intermediate frequency signal,
 wherein the discrete frequency response is configured to compensate for passband droop introduced to the sample-rate-converted baseband sample sequence by the sample rate converting step.

* * * * *